United States Patent [19]

Suyama et al.

[11] Patent Number: 5,760,464
[45] Date of Patent: Jun. 2, 1998

[54] SEMICONDUCTOR DEVICE

[75] Inventors: Yuichi Suyama, Tokyo; Yuzo Fukuzaki, Kanagawa-ken, both of Japan

[73] Assignee: Kabushiki Kaisha Toshiba, Kanagawa-ken, Japan

[21] Appl. No.: 517,509

[22] Filed: Aug. 21, 1995

[30] Foreign Application Priority Data

Aug. 23, 1994 [JP] Japan .................. 6-198357

[51] Int. Cl.⁶ .................. H01L 23/58; H01L 23/495; H01L 29/00
[52] U.S. Cl. .................. 257/665; 257/529; 257/666
[58] Field of Search .................. 257/665, 666, 257/529, 209, 210

[56] References Cited

U.S. PATENT DOCUMENTS 4,169,271  9/1979  Saitoh .................. 257/791
4,198,744  4/1980  Nicolay .................. 257/665
4,587,548  5/1986  Grabbe et al. .................. 257/668
5,068,706  11/1991  Sugita et al. .................. 257/665
5,523,617  6/1996  Asanasavest .................. 257/666

FOREIGN PATENT DOCUMENTS 4-91465   3/1992  Japan .................. 257/529
4-320364  11/1992  Japan .................. 257/529

Primary Examiner—Mahshid D. Saadat
Assistant Examiner—Jhihan B. Clark
Attorney, Agent, or Firm—Finnegan, Henderson, Farabow, Garrett & Dunner, L.L.P.

[57] ABSTRACT

A semiconductor device has a semiconductor chip with a plurality of pads, an inner lead which is connected to a plurality of pads by a plurality of bonding wires and which has a broken part portion, and a bonding wire which electrically connects broken ends of the broken portion of the inner lead and which has a fusing current smaller than that of the inner lead.

5 Claims, 6 Drawing Sheets

SEMICONDUCTOR DEVICE

BACKGROUND OF THE INVENTION

1. Field of the Invention

The present invention relates to a semiconductor device, and more specifically to an improved semiconductor device having a single inner lead to which a plurality of bonding wires are connected.

2. Description of the Background Art

There has been a semiconductor device which has a wiring construction in which a plurality of bonding wires are connected to a single inner lead.

FIG. 9 shows the construction of a semiconductor device at an intermediate stage of fabrication having such a wiring construction. In this device, a semiconductor chip 3 is mounted on a bed 10, with power supply pads 11a, 12a, and 13a for the purpose of supplying the power supply voltage Vcc, and power supply pads 11b, 12b, and 13b for the purpose of supplying the power supply voltage Vss provided on the surface of the semiconductor chip 3. The power supply pads 11a, 12a, and 13a are each connected by bonding wires 14a, 15a, and 16a, respectively, to the power supply inner lead 1a which supplies the power supply voltage Vcc. In the same manner the power supply pads 11b, 12b, and 13b are each connected by bonding wires 14b, 15b, and 16b, respectively, to the power supply inner lead 1b, which supplies the power supply voltage Vss. The inner leads 1a and 1b are connected to outer leads 2.

In this manner, a plurality of power supply pads 11a through 13a are connected to a single power supply inner lead 1a via the plurality of bonding wires 14a through 16a, and a plurality of power supply pads 11b through 13b are connected to a single power supply inner lead 1b via the plurality of bonding wires 14b through 16b.

In a semiconductor device, latchup or the like can cause a large current to flow suddenly. Because the current which flows when a bonding wire having a diameter of approximately 30 μm is melted is generally approximately 0.7A, when a single inner lead is connected by a single bonding wire, if a current exceeding 0.7 A flows, the bonding wire melts, thereby cutting off the electrical current path. This prevents damage to the semiconductor chip and test fixtures used such as in a burn-in tester.

However, in a device in which a single inner lead is connected to a number of bonding wires as noted above, the current path is not cut off until the fusing current for the total number of connected bonding wires flows, resulting in damage to the semiconductor chip or testing fixtures.

SUMMARY OF THE INVENTION

In consideration of the above situation, the present invention has an object to provide a semiconductor device in which a single inner lead is connected to a plurality of bonding wires, and which is capable of preventing damage caused by excessive current flow.

According to one aspect of the present invention, there is provided a semiconductor device including a semiconductor chip having a plurality of pads, an inner lead which is connected to the plurality of pads by a plurality of bonding wires and which includes a broken portion, and a connector which electrically connects broken ends of the broken portion and which has a fusing current which is smaller than a fusing current of the inner lead.

According to other aspect of the present invention, there is provided a semiconductor device including a semiconductor chip having a first plurality of pads for a first power supply voltage and a second plurality of pads for a second power supply voltage, a first inner lead which is connected to the plurality of pads for the first power supply voltage by a first plurality of bonding wires, and a second inner lead which is connected to the plurality of pads for the second power supply voltage by second plurality of bonding wires, wherein at least one of the first power supply voltage inner lead and the second power supply voltage inner lead including a broken portion, and further including a connector which electrically connects broken ends of the broken portion, and which has a fusing current which is smaller than a fusing current of the one of the first and second power supply voltage inner lead having the broken portion.

According to another aspect of the present invention, there is provided a semiconductor device including a semiconductor chip having a plurality of pads, an inner lead which is connected to the plurality of pads and which includes a broken portion, first connecting means for electrically connecting between one of the plurality of pads and the inner leads, second connecting means for electrically connecting between another one of the plurality of pads and the inner leads, and third connecting means for electrically connecting broken ends of broken portion and which has a fusing current which is smaller than a fusing current of the inner lead.

In the case in which a semiconductor chip is connected to an inner lead via a plurality of bonding wires, until the fusing current for the total number of bonding wires flows, the current path between the semiconductor chip and the inner lead remains unbroken, thereby risking damage to the semiconductor chip. However, by using a connection means whereby the inner lead is melted midway at a current which is smaller than the current at which the inner lead fuses, even when a large current occurs it is possible to cut off the current path, thereby preventing damage to the semiconductor chip.

In a semiconductor device which uses a first power supply and a second power supply, because at least one of the power supply voltage inner lead for the first power supply and the power supply voltage inner lead for the second power supply is broken midway, with the two ends of the connected by the above-noted connection means, the connection means is fused by the flow of a large current, thereby protecting the semiconductor chip.

It is possible to use a bonding wire, a fuse, or a conductive tape as the connection means which fuses at a smaller current than does the inner lead, thereby protecting the semiconductor chip.

In the case in which the two ends of the broken inner lead are joined in the insulated condition and electrically connected by the connection means, it is possible to achieve a high mechanical strength.

BRIEF DESCRIPTION OF THE DRAWINGS

Other objects and advantages of the present invention will become apparent during the following discussion in conjunction with the accompanying drawings, in which.

DESCRIPTION OF THE PREFERRED EMBODIMENTS

Embodiments of the present invention will be described below in detail, with reference being made to the accompanying drawings.

Figure 1:
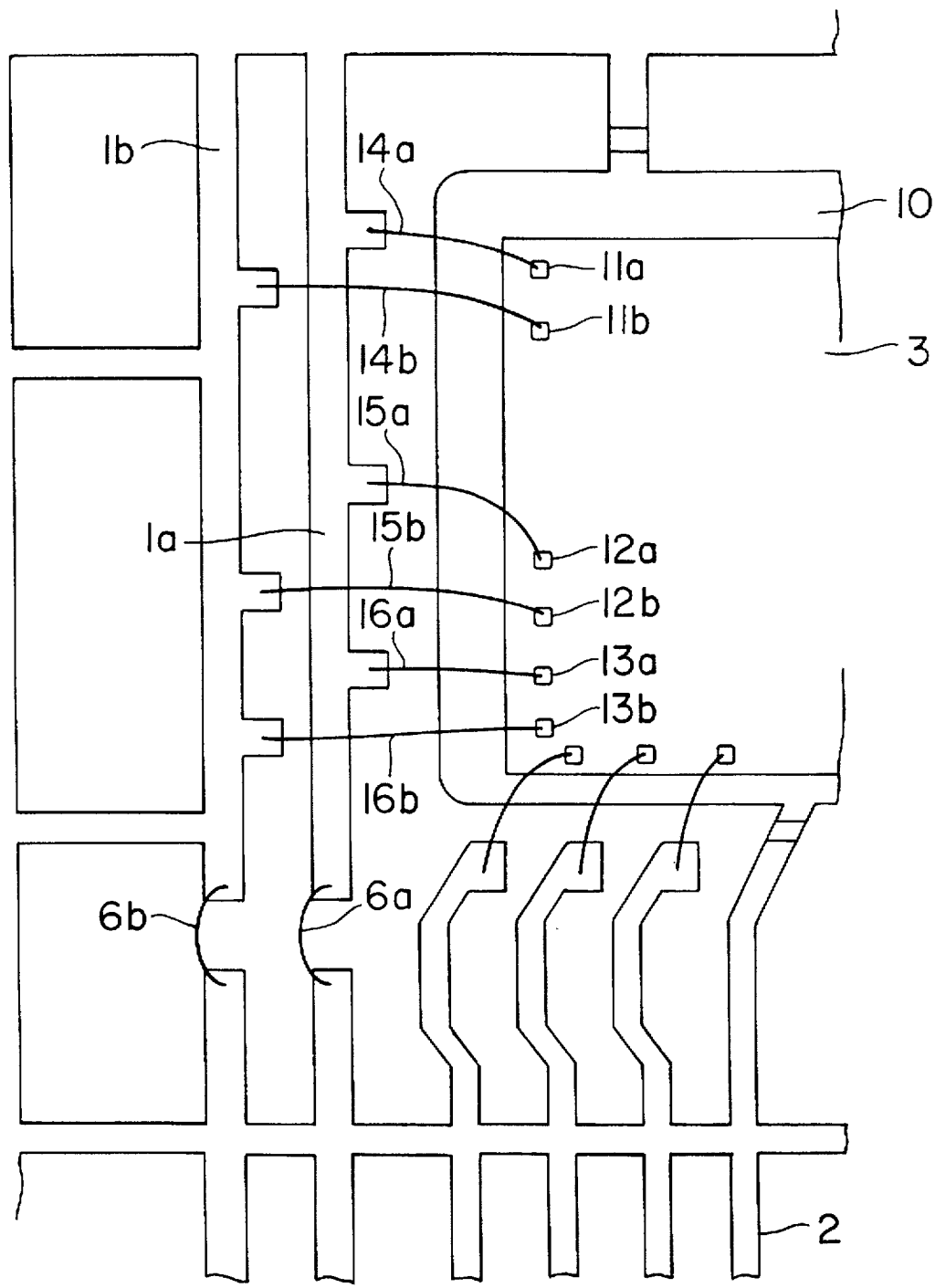
FIG. 1 is a top view of the wiring construction of a semiconductor device according to a first embodiment of the present invention.

FIG. 1 is a drawing which shows the wiring construction of a semiconductor device of the first embodiment of the present invention. With reference to the device illustrated in FIG. 1, the power supply voltage Vcc is broken along it's length, its broken ends being electrically connected together by means of a single bonding wire 6a. In the same manner, the power supply inner lead 1b for the power supply voltage Vss is broken along it's length, its broken ends being electrically connected together by means of a single bonding wire 6b. Elements which are the same as the semiconductor device of the prior art have been assigned corresponding reference numerals and will not be explicitly described herein. Normally, the power supply voltage Vcc is 5 v, and the power supply voltage Vss is 0 v. A normal current level flowing in the inner leads is, for example, 0.3 A.

According to such a wiring construction, in the case, for example, in which a large current which exceeds the fusing current level, e. g. 0.7 A, of a single bonding wire suddenly flows in the power supply voltage Vcc circuit, the bonding wire 6a which is located in the power supply inner lead 1a will melt or fuse. In the same manner, if a large current which exceeds the fusing current level of a single bonding wire suddenly flows in the power supply voltage Vss circuit, the bonding wire 6b which is located in the power supply inner lead 1b will fuse. Damage to the semiconductor chip 3 or to testing fixtures is thereby prevented.

While that the bonding-wire 6a or 6b could be gold (Au), it could instead be as silver (Ag), copper (Cu), aluminum (Al) or other such conductive materials. In selecting the bonding wire material: and diameter, it is necessary to consider the need to have the bonding wire fuse at the desired current. The inner leads are made of an alloy of iron and nickel or copper.

Figure 2:
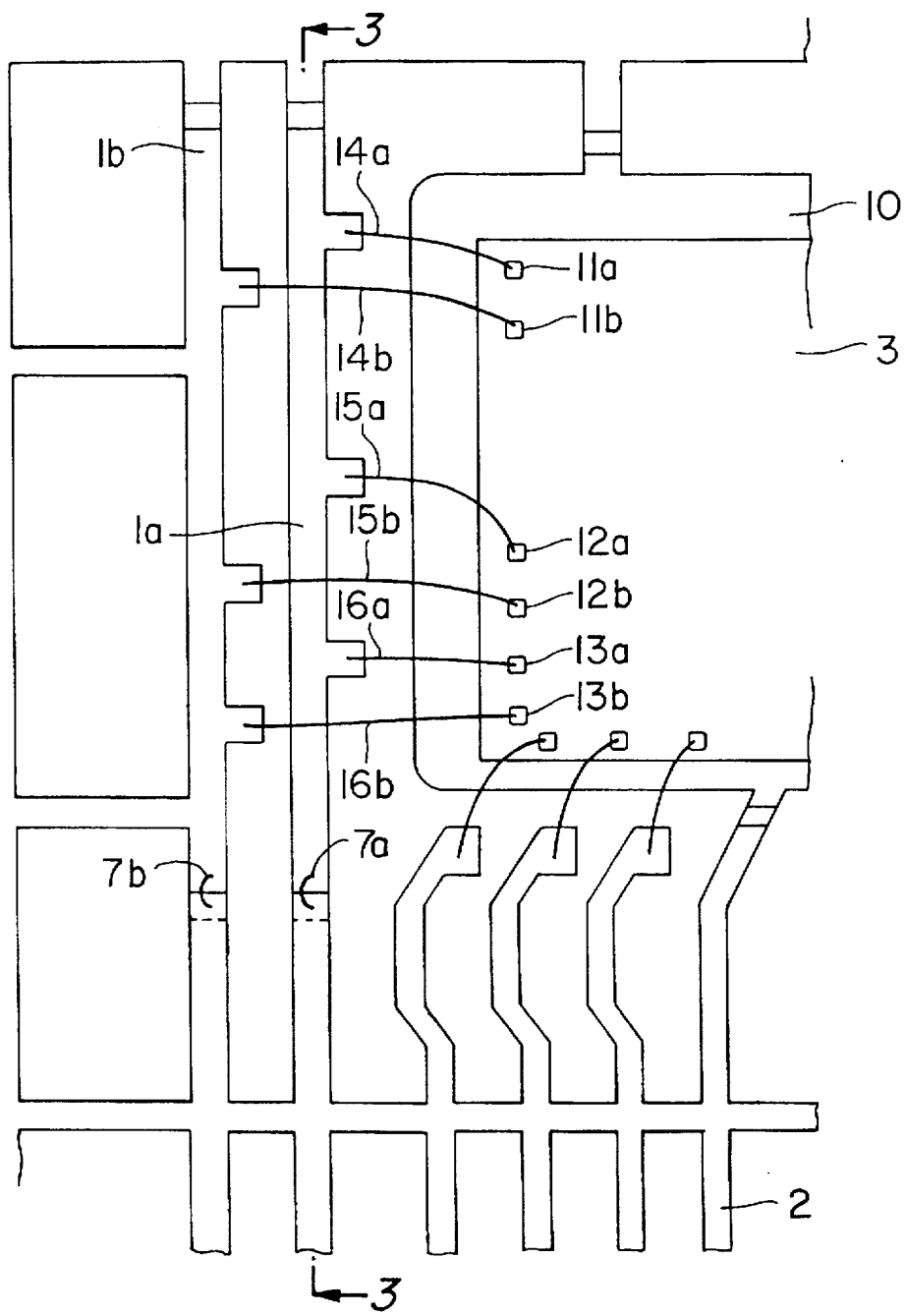
FIG. 2 is a top view of the wiring construction of a semiconductor device according to a second embodiment of the present invention.
Figure 3:
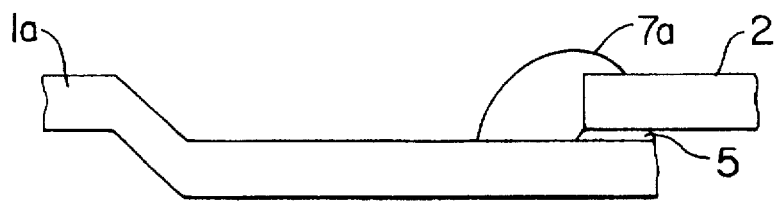
FIG. 3 is a vertical cross-sectional view as seen along the line 3—3 indicated in FIG. 2.

The wiring construction of the second embodiment of a semiconductor device according to the present invention is shown in FIG. 2. FIG. 3 shows the vertical cross-sectional view of the power supply inner lead 1a shown in FIG. 2, as viewed along the line 3—3. In this embodiment, the power supply inner leads 1a and 1b are broken and joined by means of an insulating paste 5, and electrically connected by the bonding wires 7a and 7b, respectively. Thus, this second embodiment, as is the case with the first embodiment, the wiring construction is such that the power supply inner leads 1a and 1b are broken, and are electrically connected by means of the bonding wires 7a and 7b, respectively. For this reason, when a current which exceeds the fusing current of the single bonding wire of either the power supply inner lead 1a or the power supply inner lead 1b, the bonding wire 7a or 7b, respectively, is fuse, thereby preventing damage to either the semiconductor chip 3 or testing fixtures. In addition, according to the second embodiment of the present invention, in contrast to the first embodiment, the broken locations of the power supply inner leads 1a and 1b are joined using an insulating paste 5, thereby increasing the mechanical strength at this portion.

Figure 4:
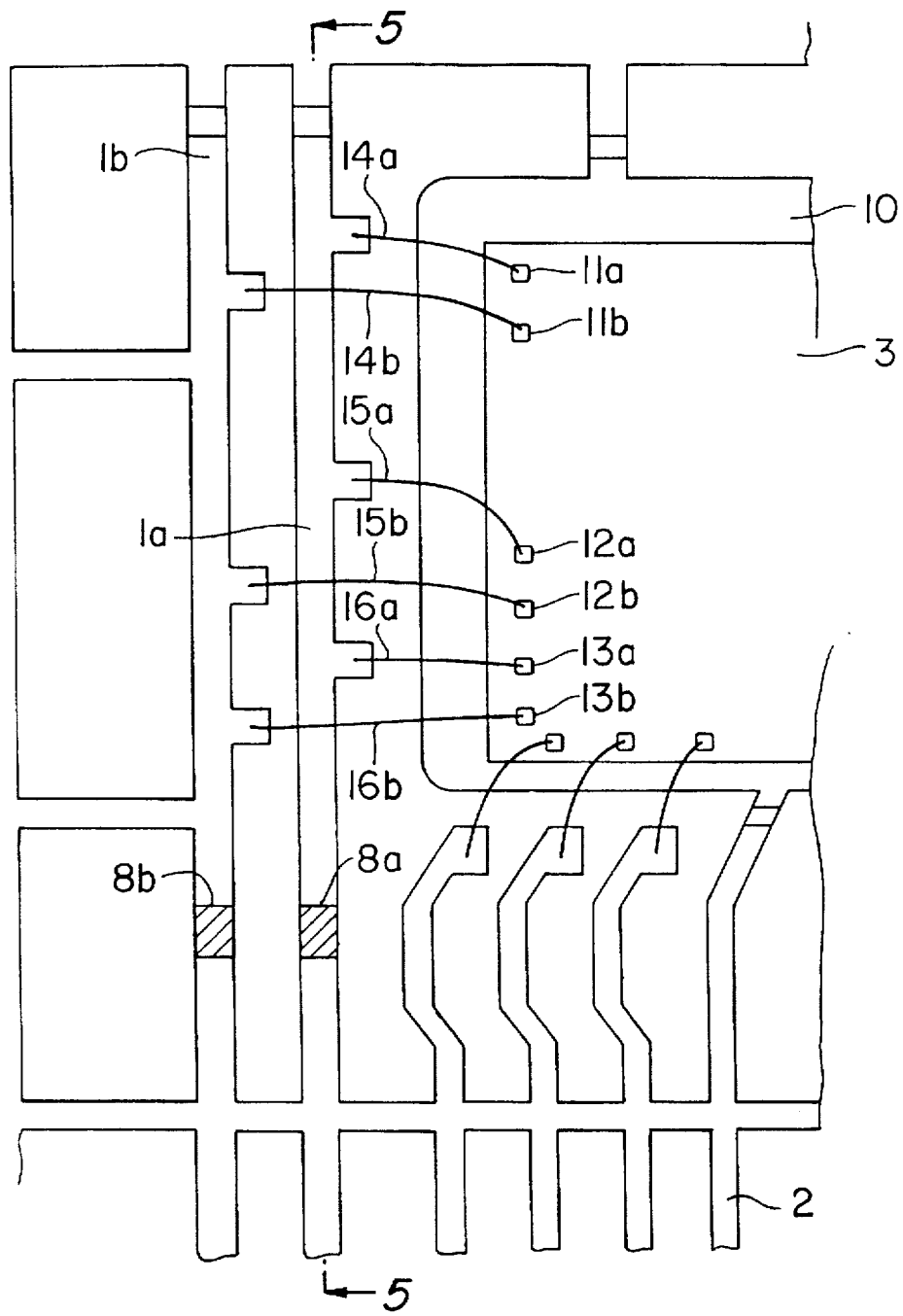
FIG. 4 is a top view of the wiring construction of a semiconductor device according to a third embodiment of the present invention.
Figure 5:
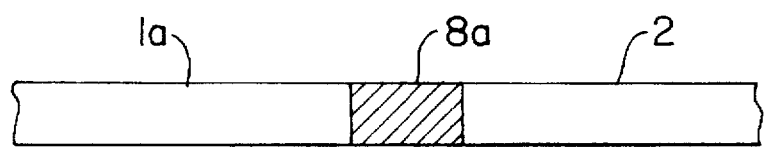
FIG. 5 is a vertical cross-sectional view as seen along the line 5—5 indicated in FIG. 4.

The third embodiment of a semiconductor device according to the present invention will be described with reference to FIG. 4. In this embodiment, the power supply inner leads 1a and 1b are broken, the broken surfaces being joined by solder 8a and 8b, respectively. FIG. 5 shows a vertical cross-sectional view along the line 5—5 shown in FIG. 4. Thus as seen for example in FIG. 5, the power supply inner lead 1a is broken, and the broken ends are joined by the solder 8a. The current value at which the solder 8a or 8b fuses is lower than the current value at which the inner lead would fuse. Therefore, if a large current flows in either the power supply inner lead 1a or the power supply inner lead 1b, the solder 8a or the solder 8b, respectively, fuses, thereby preventing the flow of a large current to the semiconductor chip 3 or the test fixtures (not shown in the drawing). While solder is shown as being used in this embodiment in joining the broken surfaces of the power supply inner leads, it is also possible to use a different conductive material.

Figure 6:
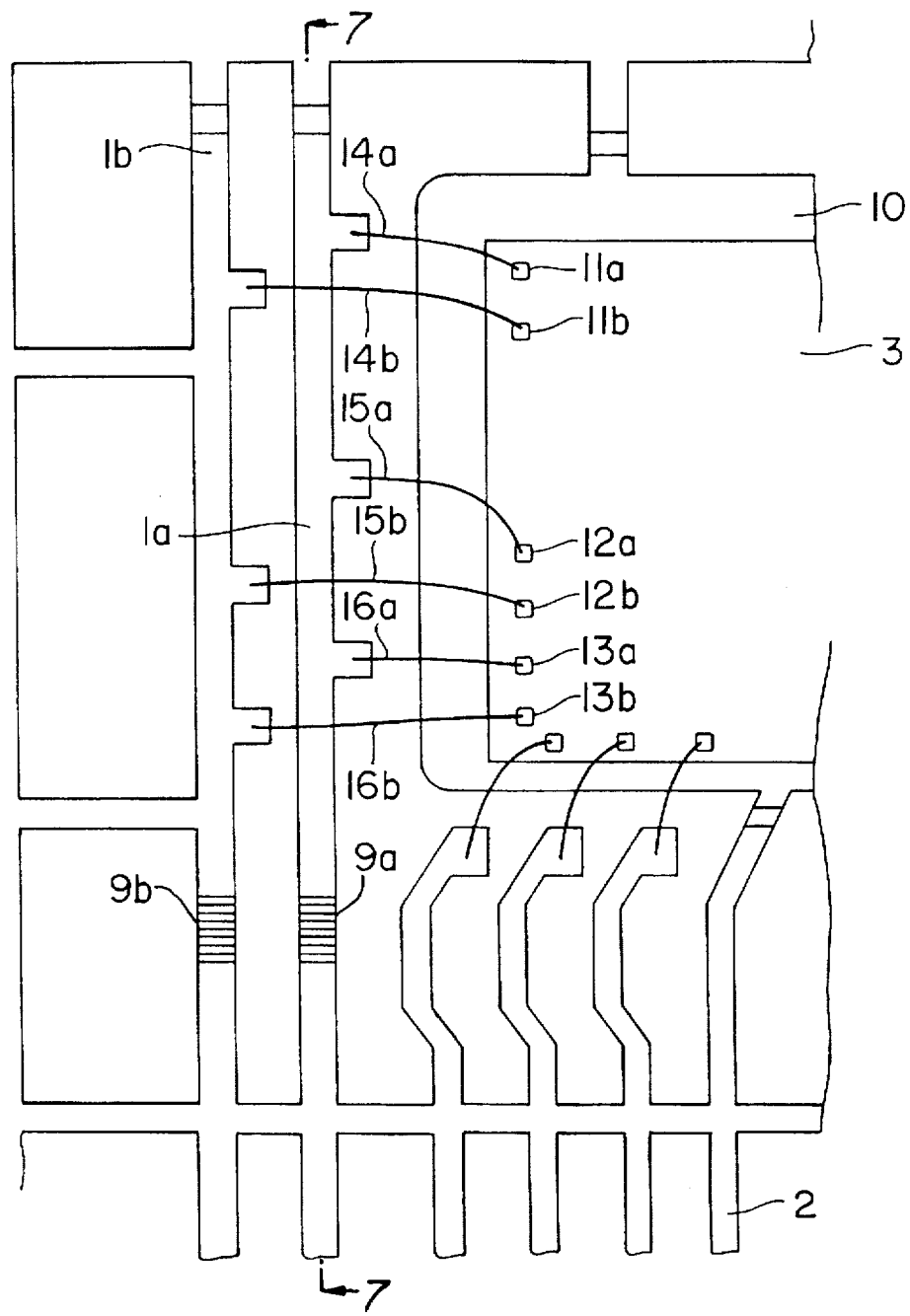
FIG. 6 a top view of a wiring construction of a semiconductor device according to a fourth embodiment of the present invention.
Figure 7:
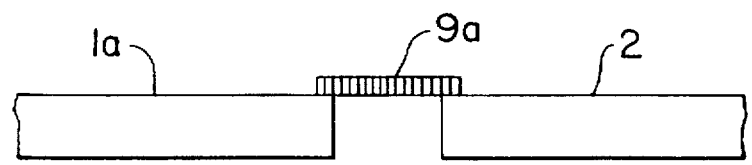
FIG. 7 a vertical cross-sectional view as seen along the line 7—7 indicated in FIG. 6.

The wiring construction of the fourth embodiment of a semiconductor device according to the present invention is shown in FIG. 6, with FIG. 7 showing a vertical cross-sectional view along the line 7—7 shown in FIG. 6. The power supply inner leads 1a and 1b are broken, with the broken locations electrically connected by means of conductive tapes 9a and 9b, respectively. The conductive tapes 9a and 9b can be formed from a conductive material such as aluminum foil, to which an adhesive is applied. The conductive tapes 9a and 9b fuse at a current smaller than that at which the inner leads woul fuse, thereby enabling the prevention of a large current from flowing in the semiconductor device or other elements.

All of the above-described embodiments are merely individual examples, and will be understood as not limiting the present invention. In the first through fourth embodiments of the present invention, the inner leads are broken, with the broken ends electrically connected by means of bonding wires, solder, or conductive tape. However, the means for electrically connecting the broken location is not limited to these specific means, but can be any means which serves as a fuse having a fusing current which is lower than that of the inner leads.

Figure 8:
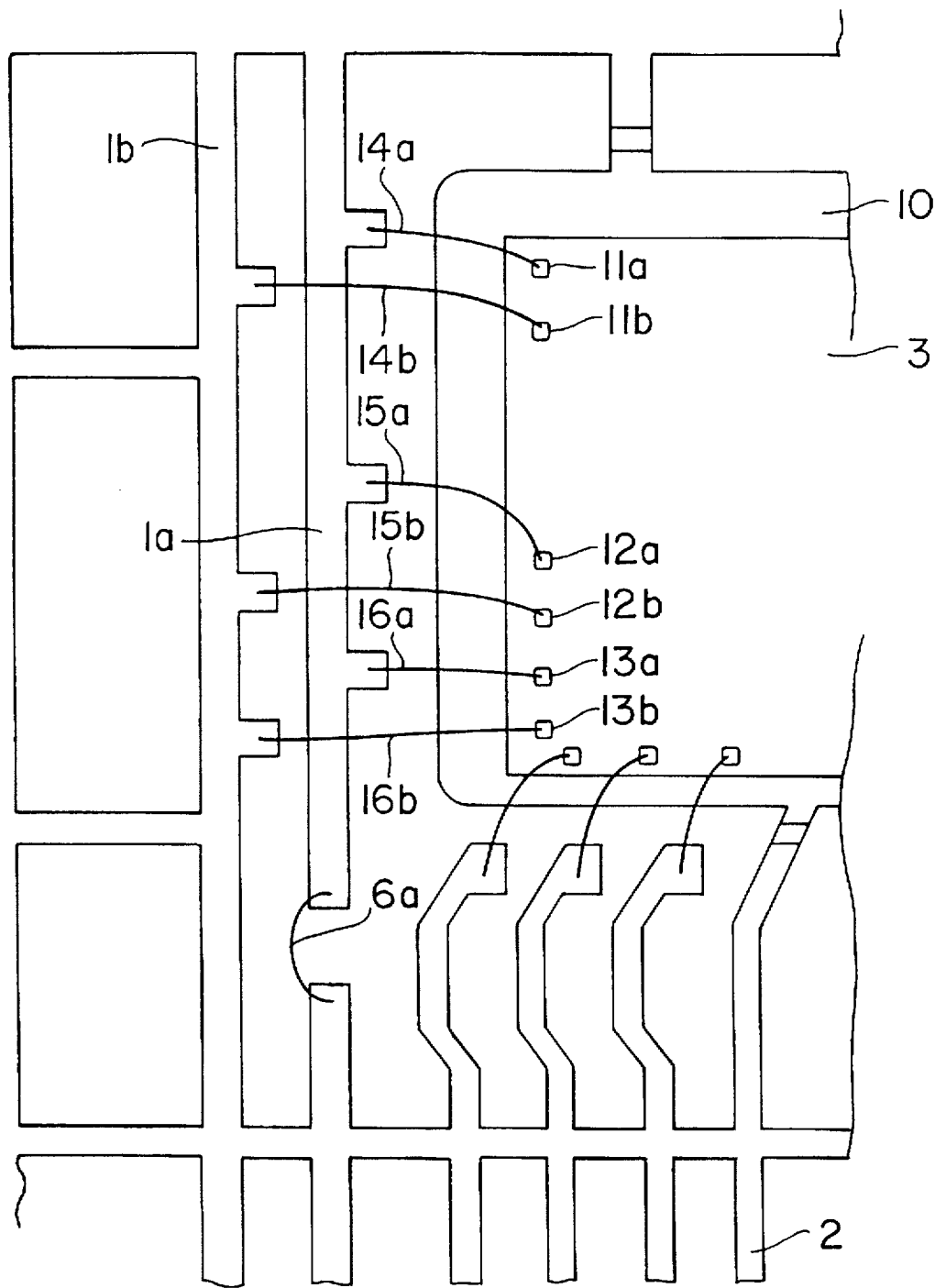
FIG. 8 is a top view of the wiring construction of a semiconductor device according to a fifth embodiment of the present invention.
Figure 9:
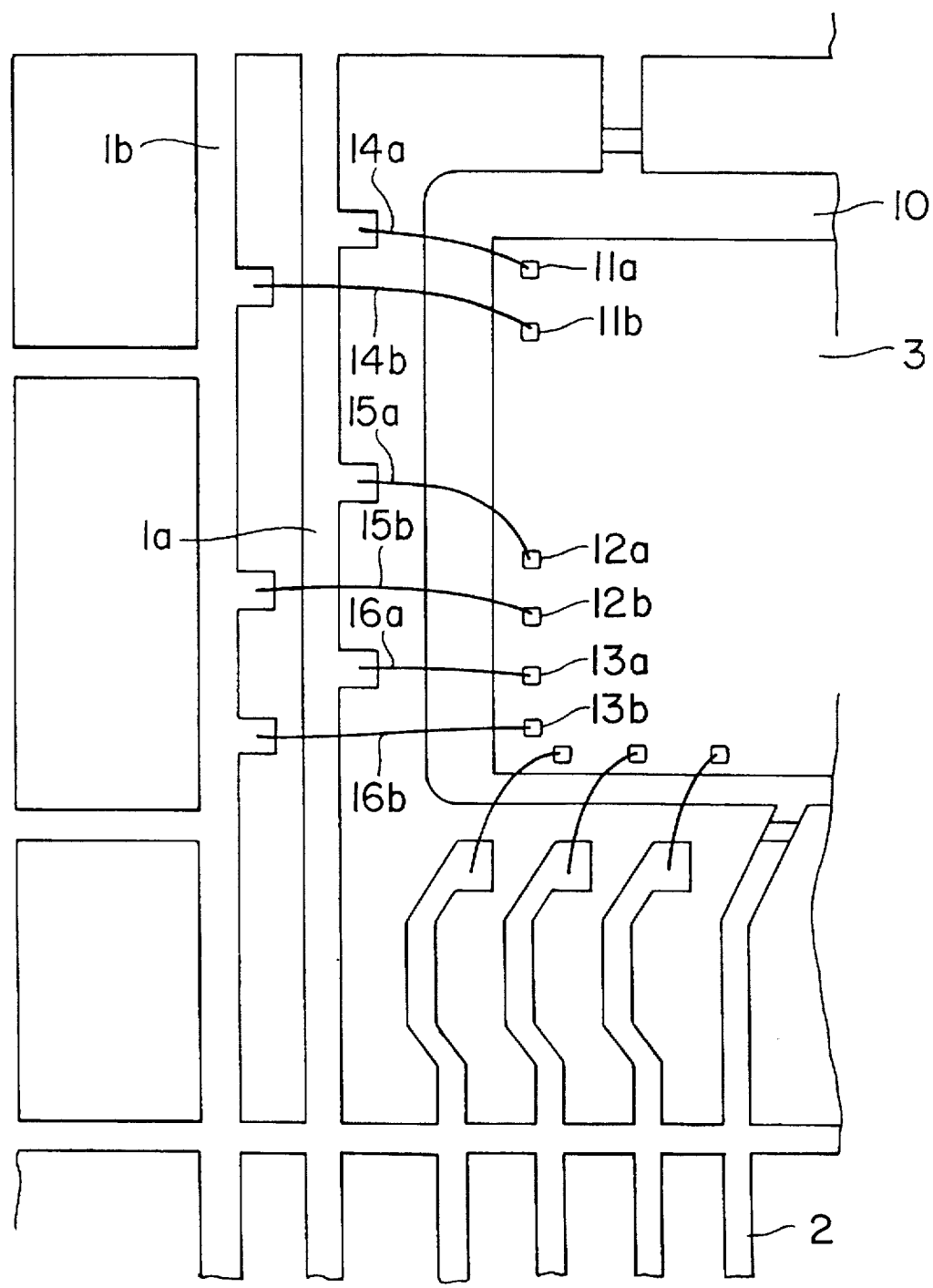
FIG. 9 is a top view of the wiring construction of a semiconductor device of the prior art.

In addition, in the above-described embodiments, both the power supply inner lead 1a which supplies the power supply voltage Vcc and the power supply inner lead 1b which supplies the power supply voltage Vss are both broken midway, the broken locations of each being connected by means of bonding wires, solder, or conductive tape. By doing this, if a large current flows in either the power supply voltage Vcc terminal or the power supply voltage Vss terminal it is possible to provide protection for the semiconductor chip and other elements. However, it is not necessary to adopt this type of wiring construction for the inner leads of both power supplies. For example, in the case in which there is a tendency for a large current to flow in the power supply voltage Vcc circuit, it is possible to use any of the above-described wiring constructions in the inner lead 1a for the power supply voltage Vcc only, as indicated in the fifth embodiment shown in FIG. 8. Furthermore, in the case in which there are three or more types of power supply voltages, it is also possible to apply the above-described wiring construction to the power supply inner leads for all three or more power supplies.

In a semiconductor device according to the present invention as described above, in which there is an inner lead to which a plurality of bonding wires are connected, because this inner lead is broken and the broken ends are electrically connected together by a connection means which has a fusing current that is smaller than that of the inner lead, when a large current flows the connection means fuses, thereby cutting off the current path and preventing damage to the semiconductor device and test fixtures such as a burn-in tester.

Numerous modifications and variations of the present invention are possible in light of the teachings. It is therefore to be understood that, within the scope of the appended claims, the present invention can be practiced in a manner other than as specifically described herein.

What is claimed is:

1. A semiconductor device comprising:

a semiconductor chip having a plurality of pads;

an inner lead connected to the plurality of pads by a plurality of bonding wires and including a broken portion; and a bonding wire connector bonded to the broken ends of the inner lead to electrically connect broken ends of broken portion of the inner lead and having a fusing current smaller than a fusing current of the inner lead.

2. A semiconductor device comprising:

a semiconductor chip having a plurality of pads;

an inner lead connected to the plurality of pads by a plurality of bonding wires and including a broken portion; and a conductive tape connector electrically connecting broken ends of the broken portion of the inner lead and having a fusing current smaller than a fusing current of the inner lead.

3. A semiconductor device comprising:

a semiconductor chip having a plurality of pads;

an inner lead connected to the plurality of pads by a plurality of bonding wires and including a broken portion;

a connector electrically connecting broken ends of the broken portion and having a fusing current smaller than a fusing current of the inner lead; and an insulating material insulating the inner lead broken ends from each other.

4. A semiconductor device comprising:

a semiconductor chip having a first plurality of pads for a first power supply voltage and a second plurality of pads for a second power supply voltage;

a first inner lead connected to the first plurality of pads for the first power supply voltage by a first plurality of bonding wires;

a second inner lead connected to the second plurality of pads for the second power supply voltage by a second plurality of bonding wires;

at least one of the first and second power supply voltage inner leads including a broken portion; and a bonding wire connector bonded to broken ends of the broken portion to electrically connect the broken ends of the broken portion, and having a fusing current smaller than a fusing current of the one of the first and second power supply voltage inner leads having the broken portion.

5. A semiconductor device comprising:

a semiconductor chip having a first plurality of pads for a first power supply voltage and a second plurality of pads for a second power supply voltage;

a first inner lead connected to the first plurality of pads for the first power supply voltage by a first plurality of bonding wires; and a second inner lead connected to the second plurality of pads for the second power supply voltage by a second plurality of bonding wires;

at least one of the first and second power supply voltage inner leads including a broken portion, and a conductive tape connector electrically connecting broken ends of the broken portion, and having a fusing current smaller than a fusing current of the one of the first and second power supply voltage inner leads having the broken portion.

* * * * *